(12) United States Patent
Op 'T Root et al.

(10) Patent No.: US 10,146,133 B2
(45) Date of Patent: Dec. 4, 2018

(54) LITHOGRAPHIC APPARATUS AND METHOD

(71) Applicant: ASML NETHERLANDS B.V., Veldhoven (NL)

(72) Inventors: Wilhelmus Patrick Elisabeth Maria Op 'T Root, Nederweert (NL); Herman Philip Godfried, Amsterdam (NL); Hubertus Petrus Leonardus Henrica Van Bussel, Asten (NL); Arij Jonathan Rijke, Eindhoven (NL); Marc Wilhelmus Maria Van Der Wijst, Veldhoven (NL); Mathijs Leonardus Johan Verhees, Someren (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/743,273

(22) PCT Filed: Jun. 3, 2016

(86) PCT No.: PCT/EP2016/062615
§ 371 (c)(1),
(2) Date: Jan. 9, 2018

(87) PCT Pub. No.: WO2017/008951
PCT Pub. Date: Jan. 19, 2017

(65) Prior Publication Data
US 2018/0203362 A1    Jul. 19, 2018

(30) Foreign Application Priority Data
Jul. 16, 2015   (EP) .................................... 15177053

(51) Int. Cl.
*G03F 7/20*                (2006.01)

(52) U.S. Cl.
CPC .......... *G03F 7/70041* (2013.01); *G03F 7/709* (2013.01); *G03F 7/70133* (2013.01); *G03F 7/70358* (2013.01); *G03F 7/70558* (2013.01)

(58) Field of Classification Search
CPC ............. G03F 7/70041; G03F 7/70133; G03F 7/70358; G03F 7/70516; G03F 7/70558; G03F 7/7085; G03F 7/709
(Continued)

(56) References Cited

U.S. PATENT DOCUMENTS 7,092,072 B2   8/2006  Moors et al.
8,553,199 B2  10/2013  Butler et al.
(Continued)

FOREIGN PATENT DOCUMENTS

CN   102914945    2/2013
EP     1098359    5/2001
(Continued)

OTHER PUBLICATIONS

International Preliminary Report on Patentability dated Jan. 16, 2018 in corresponding International Patent Application No. PCT/EP2016/062615.
(Continued)

*Primary Examiner* — Colin Kreutzer
(74) *Attorney, Agent, or Firm* — Pillsbury Winthrop Shaw Pittman LLP

(57) ABSTRACT

A technique involving projecting a pulsed radiation beam using an illumination system onto a region of a plane in a reference frame; using a scanning mechanism to move a calibration sensor relative to the reference frame such that the calibration sensor moves through the beam of radiation in the plane along a scan trajectory; determining a quantity indicative of a velocity of the illumination system relative to the reference frame; and determining information related to (Continued)

a spatial intensity distribution of the radiation beam in the plane in dependence on: (a) an output of the calibration sensor; (b) the scan trajectory of the calibration sensor; and (c) the quantity indicative of a velocity of the illumination system relative to the reference frame.

20 Claims, 5 Drawing Sheets

(58) Field of Classification Search
USPC .......... 355/67, 68, 77; 356/121; 372/29.014
See application file for complete search history.

(56) References Cited

U.S. PATENT DOCUMENTS

| | | | |
|---|---|---|---|
| 2002/0018194 A1* | 2/2002 | Benschop | G03F 7/70058 355/69 |
| 2004/0114122 A1* | 6/2004 | Teeuwen | G03F 7/70133 355/68 |
| 2006/0001856 A1 | 1/2006 | Moors et al. | |
| 2006/0268252 A1 | 11/2006 | Na | |
| 2006/0290916 A1 | 12/2006 | Yamamoto et al. | |
| 2009/0147230 A1 | 6/2009 | Butler et al. | |
| 2010/0302525 A1* | 12/2010 | Zimmerman | G03F 7/70133 355/71 |
| 2014/0252216 A1 | 9/2014 | Nonaka | |

FOREIGN PATENT DOCUMENTS

| | | |
|---|---|---|
| EP | 1174769 | 1/2002 |
| JP | 2000-003873 | 1/2000 |
| WO | 2015/062921 | 5/2015 |

OTHER PUBLICATIONS

International Search Report and Written Opinion dated Sep. 26, 2016 in corresponding International Patent Application No. PCT/EP2016/062615.

* cited by examiner

LITHOGRAPHIC APPARATUS AND METHOD

CROSS REFERENCE TO RELATED APPLICATIONS

This application is the U.S. national phase entry of PCT patent application no. PCT/EP2016/062615, which was filed on Jun. 3, 2016, which claims the benefit of priority of EP application no. 15177053.4, which was filed on Jul. 16, 2015, and which is incorporated herein in its entirety by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called scanners, in which each target portion is irradiated by scanning the pattern through the beam in a given direction (the "scanning"-direction) while synchronously scanning the substrate parallel or anti parallel to this direction.

It is desirable to provide a lithographic apparatus that allows one to accurately control the dose of radiation received by each point on the target portion of the substrate. The dose of radiation received by a part of the target area of the substrate may be defined as the amount of energy per unit area which is received by that part. Accurate control of the dose of radiation in turn allows variation of the critical dimension of features formed on the substrate to be controlled.

It is an object of the present invention to provide a lithographic apparatus and a device manufacturing method that at least partially addresses one or more of the problems of the prior art, whether identified herein or elsewhere.

SUMMARY

According to an aspect of the invention, there is provided a method for determining information related to a spatial intensity distribution of a radiation beam comprising: providing a calibration sensor; providing a pulsed radiation beam using an illumination system; projecting the pulsed radiation beam onto a region of a plane in a reference frame; using a scanning mechanism to move the calibration sensor relative to the reference frame such that the calibration sensor moves through the beam of radiation in the plane along a scan trajectory; determining a quantity indicative of a velocity of the illumination system relative to the reference frame; and determining information related to a spatial intensity distribution of the radiation beam in the plane in dependence on: (a) an output of the calibration sensor; (b) the scan trajectory of the calibration sensor; and (c) the quantity indicative of a velocity of the illumination system relative to the reference frame.

As the calibration sensor moves through the radiation beam in the plane along the scan trajectory it will be irradiated by a plurality of pulses of the radiation beam. The calibration sensor will receive a dose of radiation from each pulse, given by the power of that pulse weighted by the intensity of the slit profile at the position in the slit that the calibration sensor is in when it receives that pulse. In so doing, the calibration sensor effectively samples the slit profile a plurality of times (once for each radiation pulse). For linear motion of the calibration sensor at a constant scan speed and a constant pulse frequency, one would expect the slit profile to be sampled substantially evenly, i.e. for the distance (in the scanning direction) between adjacent samples to be substantially constant. However, any movement of the illumination system alters the spacing between each pair of samples, which could introduce an error. Advantageously, by also combining the quantity indicative of a velocity of the illumination system relative to the reference frame the first aspect ensures that such errors may be eliminated or at least substantially reduced.

The quantity indicative of a velocity of the illumination system relative to the reference frame may be an acceleration of the radiation system in a scanning direction and the method may comprise the step of integrating the acceleration over a resolution time to calculate an average velocity of the illumination system in the scanning direction during said resolution time.

The method may further comprise: determining a power of each pulse of radiation provided by the illumination system, and wherein the information related to a spatial intensity distribution of the radiation beam in the plane may also be determined in dependence on the power of pulses of radiation provided by the illumination system.

The information related to a spatial intensity distribution of the radiation beam in the plane may comprise: (i) a plurality of determined intensities; and (ii) a quantity indicative of a position in the radiation beam that corresponds to each of the plurality of intensities.

The plurality of intensities may be proportional to an individual dose of radiation that is received by a sensing element of the calibration sensor.

Each of the plurality of intensities may be proportional to a ratio of the individual dose of radiation that is received by a sensing element of the calibration sensor from a pulse of the pulsed radiation beam to the power of that pulse of radiation. By taking the ratio of the individual dose of radiation (as determined by the calibration sensor) to a power of the pulsed radiation beam (for example as determined by another radiation sensor), any dependence on the output power of the radiation source can be effectively factorized away so that the intensity of the slit profile may be determined. Therefore, any variation in the output power of the radiation source over the pulses of radiation that are received by the calibration sensor is effectively removed.

The quantity indicative of a position in the radiation beam that corresponds to each of the plurality of intensities may be determined in dependence on: the scan trajectory of the calibration sensor; and the quantity indicative of a velocity of the illumination system relative to the reference frame.

The quantity indicative of a position in the radiation beam that corresponds to each of the plurality of intensities may comprise a spacing in a scanning direction between that corresponding intensity and an adjacent intensity.

The spacing in the scanning direction may be given by a ratio of the magnitude of a vector sum of a scan velocity of the calibration sensor and the instantaneous velocity of the radiation beam in the scanning direction relative to the reference frame and in the plane to a pulse frequency of the radiation source.

The quantity indicative of a position in the radiation beam that corresponds to each of the plurality of intensities comprises a sum of the spacings in a scanning direction between each intensity and an adjacent intensity from one side of the radiation beam to the corresponding intensity.

The information related to a spatial intensity distribution of the radiation beam in the plane may be proportional to an estimate of an integral of the intensity distribution of the radiation beam across a scanning direction.

The estimate of the integral of the intensity distribution of the radiation beam across a scanning direction may be determined by calculating a weighted sum of the plurality of intensities.

The weight for each of the plurality of intensities may be proportional to a magnitude of a vector sum of a scan velocity of the calibration sensor and an instantaneous velocity of the radiation beam in the scanning direction, relative to the reference frame and in the plane. Such a weight is proportional to the distance in the scanning direction that the calibration sensor has moved (relative to the radiation beam) between irradiation by two successive pulses of radiation. Therefore, such embodiments provide a numerical estimate of the integral of the slit profile across the scanning direction based on a rectangle method of integration.

The weight for each of the plurality of intensities may be inversely proportional to a pulse frequency of the radiation source.

According to a second aspect of the invention there is provided a method of calibrating a lithographic apparatus comprising the method of the first aspect of the invention.

According to a third aspect of the invention there is provided a lithography method comprising: providing a substrate; providing a beam of radiation using a radiation system; using a patterning device to impart the radiation beam with a pattern in its cross-section; projecting the patterned radiation beam onto a target portion of the substrate; and using a scanning mechanism to move the substrate relative to a frame such that the patterned radiation beam moves over a surface of the substrate; wherein a power of the radiation beam is controlled in dependence on information related to a spatial intensity distribution of the radiation beam in a plane of the substrate which has been determined using the method of the first aspect of the invention.

The lithography method may further comprise determining a power of the radiation beam and the power of the radiation beam may also be controlled in dependence on the determined power of the bream of radiation.

The power of the radiation beam may be controlled so as to ensure that one or more parts of the target portion receive a desired dose of radiation.

According to a fourth aspect of the invention there is provided a lithographic apparatus comprising: an illumination system configured to condition a pulsed radiation beam; a reference frame; a substrate table moveably mounted to the reference frame, the substrate table for holding a substrate such that a target portion of the substrate is arranged to receive the radiation beam; a projection system configured to project the radiation beam onto the substrate; a scanning mechanism operable to move the substrate table relative to the frame; a mechanism operable to determine a quantity indicative of a velocity of the illumination system relative to the frame; a calibration sensor that can be positioned on the substrate table during a calibration method; and a controller; wherein during the calibration method the scanning mechanism is operable to move the substrate table relative to the reference frame such that the calibration sensor moves through the beam of radiation in the plane along a scan trajectory, and the controller is operable to determine information related to a spatial intensity distribution of the radiation beam in the plane in dependence on: (a) an output of the calibration sensor; (b) the scan trajectory of the calibration sensor; and (c) the quantity indicative of a velocity of the illumination system relative to the reference frame.

The controller may be operable to implement the method of the first aspect of the invention.

The mechanism operable to determine a quantity indicative of a velocity of the illumination system relative to the reference frame may comprise one or more accelerometers mounted on the illumination system.

The mechanism operable to determine a quantity indicative of a velocity of the illumination system relative to the reference frame may comprise one or more cameras mounted on the reference frame which are operable to measure movement of a band of radiation exiting the illumination system.

The calibration sensor may comprise a sensing element. In some embodiments, the calibration sensor may comprise a plurality of sensing elements.

The calibration sensor may comprise an opaque substrate and the sensing element may comprise an aperture in said opaque substrate. For embodiments wherein the calibration sensor comprises a plurality of sensing elements, each sensing element may comprise an aperture in the opaque substrate.

The sensing element may further comprise a radiation sensor disposed behind the aperture. For embodiments wherein the calibration sensor comprises a plurality of sensing elements, each sensing element may comprise a radiation sensor disposed behind its aperture.

The aperture in the opaque substrate may have a diameter of the order of 100 μm.

The lithographic apparatus may further comprise a support structure for supporting a patterning device, wherein the illumination system is arranged to project the radiation beam onto the patterning device such that the patterning device imparts a pattern in its cross-section before it is received by the target portion of the substrate.

The support structure may be moveably mounted to the frame and the scanning mechanism may be further operable to move the support structure relative to the frame.

According to a fifth aspect of the invention there is provided a computer program operable to implement the method of the first aspect of the invention.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
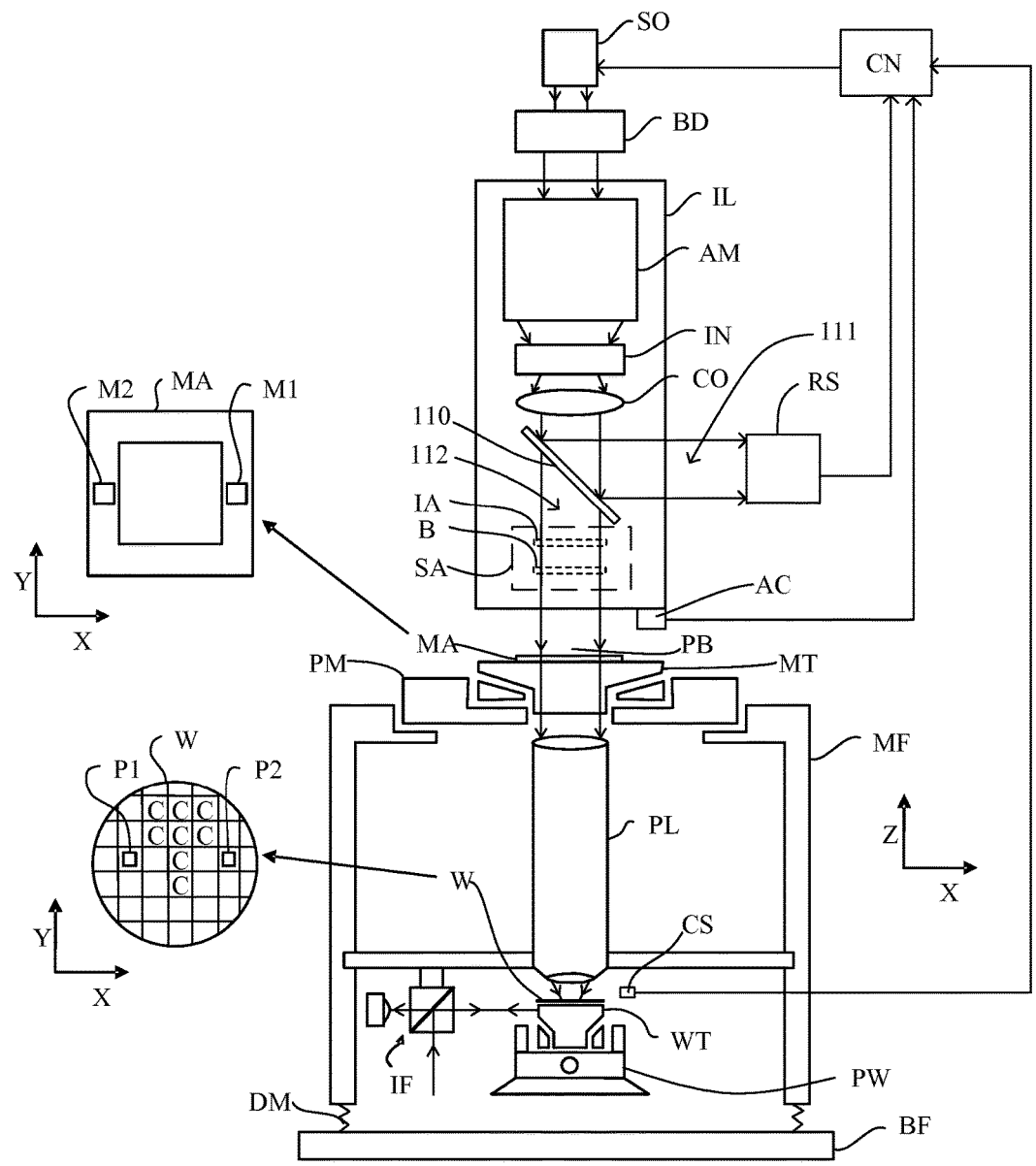
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may have a single substrate table and a single support structure. Alternatively, the lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL for conditioning a beam PB of radiation (e.g. UV radiation or DUV radiation);

a frame MF;

a base frame BF;

a support structure (e.g. a mask table) MT to support a patterning device (e.g. a mask) MA;

a substrate table (e.g. a wafer table) WT for holding a substrate (e.g. a resist coated wafer) W; and a projection system (e.g. a refractive projection lens) PL configured to image a pattern imparted to the radiation beam PB by patterning device MA onto a target portion C (e.g. comprising one or more dies) of the substrate W.

The base frame BF may be supported on the ground. The frame MF is a vibration isolated frame that is substantially isolated from external influences, such as vibrations in the base frame BF, by the use of acoustically damping mounts DM, which support the frame MF on the base frame BF. These acoustically damping mounts DM may be actively controlled to isolate vibrations which are introduced by the base frame BF and/or by the isolated frame MF itself.

The projection system PL is connected to the isolated frame MF. The support structure MT is movably mounted to the frame MF via a first positioning device PM. The first positioning device PM may be used to move the patterning device MA, and to accurately position it, relative to the frame MF (and the projection system PL which is connected to the frame MF). The substrate table WT is movably mounted to the frame MF via a second positioning device PW. The second positioning device PW may be used to move the substrate W, and to accurately position it, relative to the frame MF (and the projection system PL which is connected to the frame MF). The second positioning device PW may be referred to as a scanning mechanism. Alternatively, the first and second positioning devices PM, PW may be collectively referred to as a scanning mechanism. The support structure MT and the substrate table WT may be referred to collectively as object tables.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may comprise adjusting means AM for adjusting the angular intensity distribution of the beam. Generally, at least the outer and/or inner radial extent (commonly referred to as -outer and -inner, respectively) of the intensity distribution in a pupil plane of the illuminator can be adjusted. In addition, the illuminator IL generally comprises various other components, such as an integrator IN and a condenser CO.

The shape and (spatial) intensity distribution of the conditioned beam of radiation PB are defined by optics of the illuminator IL. In a scan mode, the conditioned radiation beam PB may be such that it forms a generally rectangular band of radiation on the patterning device MA. The band of radiation may be referred to as an exposure slit (or slit). The slit may have a longer dimension (which may be referred to as its length) and a shorter dimension (which may be referred to as its width). The width of the slit may correspond to a scanning direction (Y direction in FIG. 1) and the length of the slit may correspond to a non-scanning direction (X direction in FIG. 1). In a scan mode, the length of the slit limits the extent in the non-scanning direction of the target region C that can be exposed in a single dynamic exposure. In contrast, the extent in the scanning direction of the target region C that can be exposed in a single dynamic exposure is determined by the length of the scanning motion.

The terms "slit", "exposure slit" or "band or radiation" may be used interchangeably to refer to the band of radiation that is produced by the illuminator IL in a plane perpendicular to an optical axis of the lithographic apparatus. This plane may be at, or close to, either the patterning device MA or the substrate W. This plane may be stationary with respect to the frame MF. The terms "slit profile", "profile of the radiation beam", "intensity profile" and "profile" may be used interchangeably to refer to the shape of the (spatial) intensity distribution of the slit, especially in the scanning direction. In a plane perpendicular to an optical axis of the lithographic apparatus, an exposure region may refer to a region of the plane which can receive radiation.

The illuminator IL comprises two masking blades (shown schematically in FIG. 1 as B). Each of the two masking blades is generally parallel to the length of the slit, the two masking blades being disposed on opposite sides of the slit. Each masking blade is independently movable between a retracted position wherein it is not disposed in the path of the radiation beam PB and an inserted position wherein it partially blocks the radiation beam PB. The masking blades are disposed in a field plane of the illuminator IL. Therefore, by moving the masking blades into the path of the radiation beam, the profile of the radiation beam PB can be sharply truncated thus limiting the extent of the field of radiation beam PB in the scanning direction. The masking blades can be used to control which parts of an exposure region receive radiation.

The patterning device MA is also disposed in a field plane of the lithographic apparatus. In one embodiment, the masking blades may be disposed adjacent to the patterning device MA such that both the masking blades and the patterning device MA lie in substantially the same plane. Alternatively, the masking blades may be separated from the patterning device MA such that they each lie in a different field plane of the lithographic apparatus and suitable focusing optics (not shown) may be provided between the masking blades and the patterning device MA.

Figure 2A:
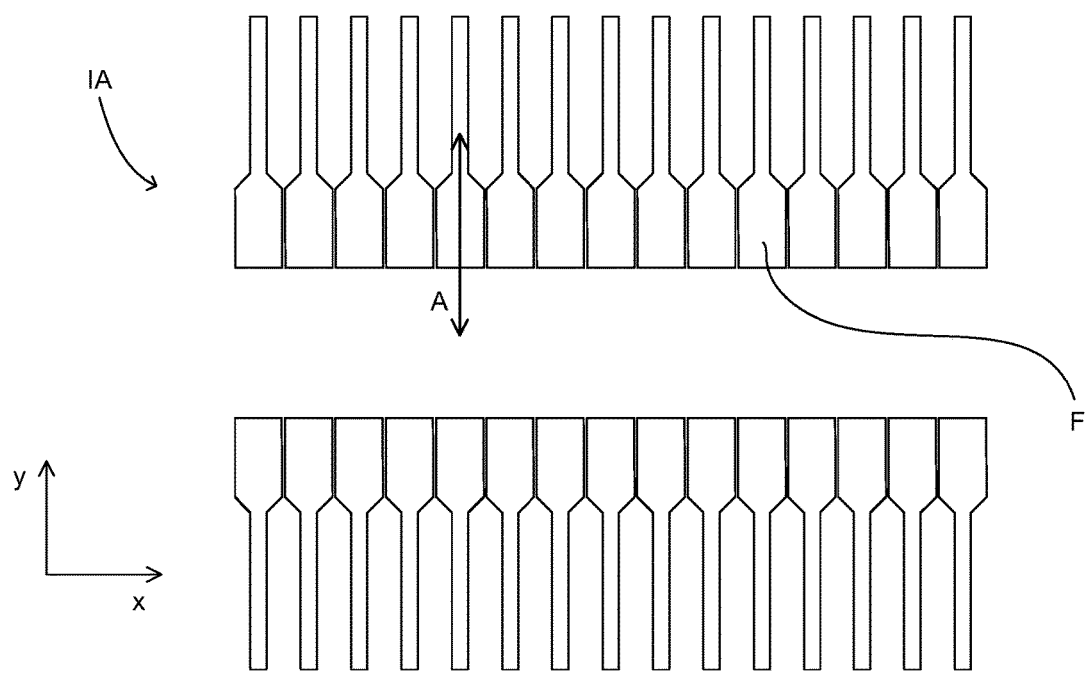
FIG. 2A is a schematic illustration of an intensity adjustor (shown in a first configuration) that forms part of the lithographic apparatus of FIG. 1.
Figure 2B:
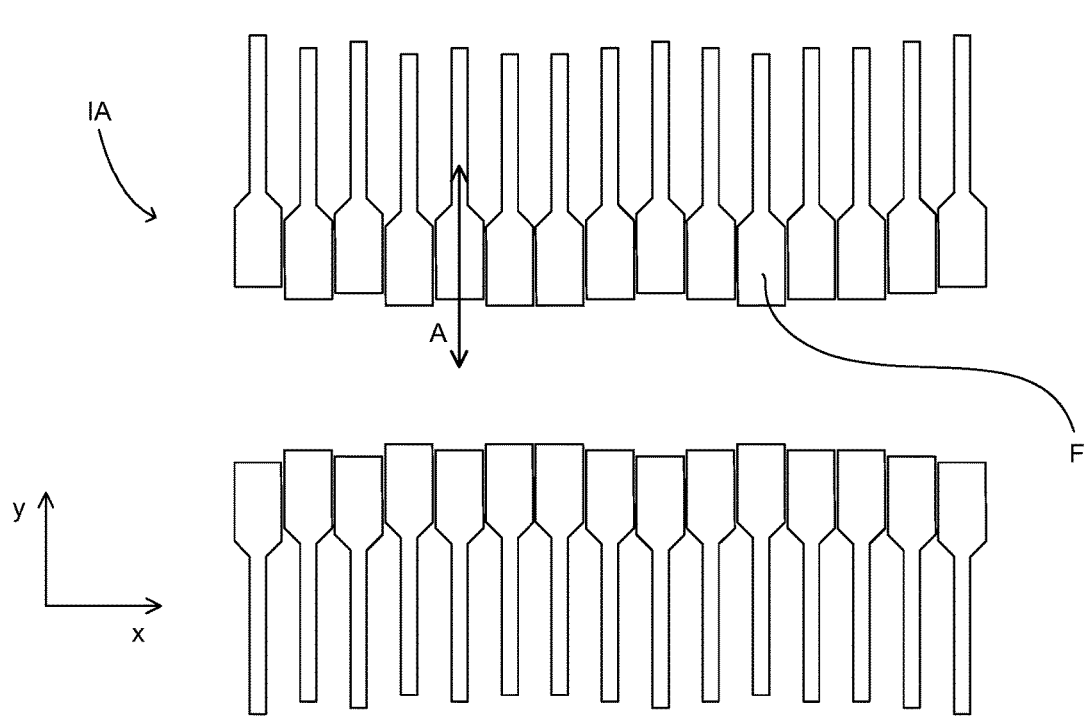
FIG. 2B is a schematic illustration of an intensity adjustor (shown in a second configuration) that forms part of the lithographic apparatus of FIG. 1.

The illuminator IL comprises an intensity adjustor IA (shown schematically in FIG. 1). As shown in FIGS. 2A and 2B, the intensity adjustor IA comprises a plurality of movable fingers F, shown in two different configurations. The fingers F are arranged in pairs, each pair comprising one finger on each side of the slit (i.e. each pair of fingers F is separated in the y-direction). The pairs of fingers F are arranged along the length of the slit (i.e. extending in the x-direction). Each movable finger F is independently movable in the scanning direction (y-direction in FIGS. 2A and 2B), as indicated by arrow A for one of the fingers F in FIG. 2A. That is, the fingers F are moveable in a direction perpendicular to the length of the slit. In use, each movable finger F is independently movable in the scanning direction. For example, each movable finger F may be movable between at least a retracted position wherein it is not disposed in the path of the radiation beam and an inserted position wherein it partially blocks the radiation beam. In FIG. 2A all of the fingers on each side of the slide are shown disposed at the same y position. As shown in FIG. 2B, in general the fingers on a given side of the slit may be disposed at different y positions each pair. By moving the fingers F, the shape and/or the intensity distribution of the slit can be adjusted.

The fingers F may not be in a field plane of the lithographic apparatus and the field may be in the penumbra of the fingers such that the fingers do not sharply cut off the radiation beam PB. The pairs of fingers may be used to apply a different level of attenuation of the radiation beam PB along the length of the slit.

The intensity function of the radiation beam PB may vary across the width of the slit, which may correspond to a scanning direction. The shape of the intensity function across the width of the slit may be referred to as a profile of the radiation beam PB (or slit profile). The profile of the radiation beam PB may be substantially the same along the length of the slit. Additionally or alternatively, the integral of the intensity profile of the radiation beam PB across the width of the slit may be substantially constant along the length of the slit. This may be achieved by inserting the pairs of fingers into the path of the radiation beam PB by different amounts so as to attenuate the radiation beam by different amounts along the length of the slit, as schematically illustrated in FIG. 2B. For such embodiments, where the pairs of fingers are inserted into the path of the radiation beam PB by different amounts, the profile of the radiation beam PB will vary slightly along the length of the slit.

The illuminator IL provides a conditioned beam of radiation PB, having a desired uniformity and intensity distribution in its cross section. The fingers F and the masking blades B may be considered to define a slit aperture SA of the illuminator IL through which the conditioned beam of radiation PB exits the illuminator IL.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately relative to the frame MF, e.g. so as to position different target portions C in the path of the beam PB. Similarly, the first positioning device PM and another position sensor (which is not explicitly depicted in FIG. 1) can be used to accurately position the patterning device MA with respect to the frame MF, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2.

The projection system PS may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT relative to the beam of radiation PB that has been conditioned by the illuminator IL along a scanning path. In an embodiment, the support structure MT is moved linearly in a scanning direction at a constant scan velocity $v_{MT}$. As described above, the slit is orientated such that its width extends in the scanning direction (which coincides with the Y-direction of FIG. 1). At any instance each point on the patterning device MA that is illuminated by the slit will be imaged by the projection system PL onto a single conjugate point in the plane of the substrate W. As the support structure MT moves in the scanning direction, the pattern on the patterning device MA moves across the width of the slit with the same velocity as the support structure MT. In particular, each point on the patterning device MA moves across the width of the slit in the scanning direction at velocity $v_{MT}$. As a result of the motion of this support structure MT, the conjugate point in the plane of the substrate W corresponding to each point on the patterning device MA will move relative to the slit in the plane of the substrate table WT.

In order to form an image of the patterning device MA on the substrate W, the substrate table WT is moved such that the conjugate point in the plane of the substrate W of each point on the patterning device MA remains stationary with respect to the substrate W. The velocity (both magnitude and direction) of the substrate table WT relative to the projection system PL is determined by the demagnification and image reversal characteristics of the projection system PL (in the scanning direction). In particular, if the characteristics of the projection system PL are such that the image of the patterning device MA that is formed in the plane of the substrate W is inverted in the scanning direction then the substrate table WT should be moved in the opposite direction to the support structure MT. That is, the motion of the substrate table WT should be anti-parallel to the motion of the support structure MT. Further, if the projection system PL applies a reduction factor $\alpha$ to the radiation beam PB then the distance travelled by each conjugate point in a given time period will be less than that travelled by the corresponding point on the patterning device by a factor of $\alpha$. Therefore the magnitude of the velocity $|v_{WT}|$ of the substrate table WT should be $|v_{MT}|/\alpha$.

The illuminator IL illuminates an exposure region of the patterning device MA with radiation beam PB and the projection system PL focuses the radiation at an exposure region in a plane of the substrate W. The masking blades of the illuminator IL can be used to control the width of the slit of radiation beam PB, which in turn limits the extent of the exposure regions in the planes of the patterning device MA and the substrate W respectively. That is the masking blades of the illuminator serve as a field stop for the lithographic apparatus. As example of how the masking blades are used is now described with reference to FIG. 3.

FIG. 3 illustrates the positions of two masking blades B1, B2 at different stages during the exposure of a target region 104 of a substrate W. Target region 104 may, for example, be any one of the target regions C illustrated in FIG. 1.

Figure 3B:
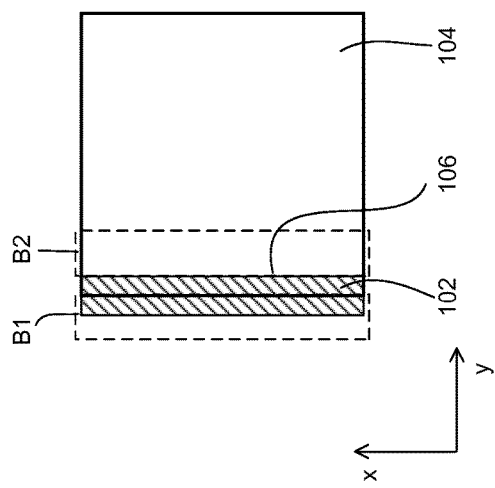
FIGS. 3A-3D illustrate the position of a band of radiation projected onto a target region of a substrate by the lithographic apparatus of FIG. 1 and the positions of two masking blades during a dynamic exposure process.
Figure 3D:
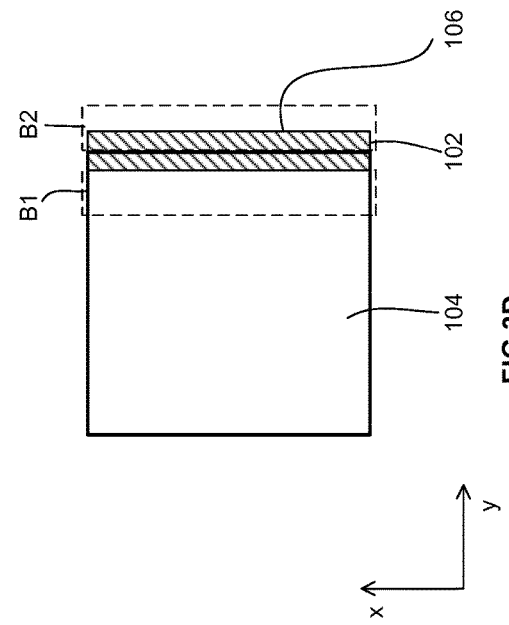
Figure 3A:
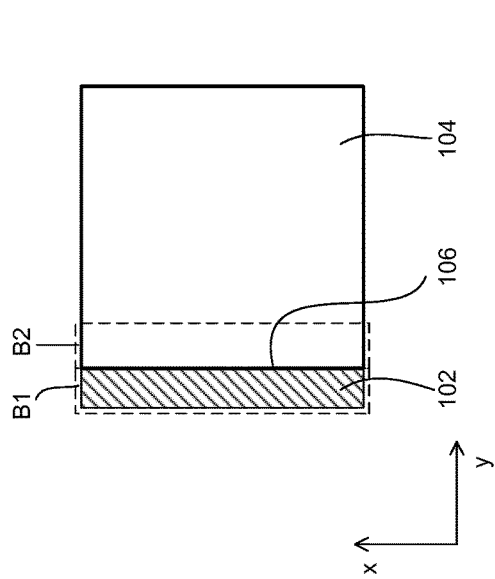

As shown in FIG. 3A, at the start of a single dynamic exposure of the target region 104, the exposure region 102 in the plane of the substrate W (i.e. the portion of the substrate that the slit is projected onto by projection system PL) is adjacent to the target region 104. The extent of the exposure region 102 in the non-scanning direction (x-direction) is substantially the same as that of the target region 104 and the exposure region 102 is aligned with the target region 104 in the non-scanning direction (x-direction). The extent of the exposure region 102 in the scanning direction (y-direction) may be different from that of the target region 104. In the scanning direction (y-direction) the exposure region 102 is adjacent to the target region 104 such that the exposure region 102 neither overlaps nor is spaced apart from the target region 104 (i.e. a leading edge 106 of the exposure region 102 substantially coincides with an edge of the target region 104).

In FIG. 3, projections of the two masking blades B1, B2 onto the plane of the substrate W are shown as dashed lines. At the start of the dynamic exposure of target region 104 (with the target region 104 disposed as shown in FIG. 3A) a first one of the masking blades B1 of the slit is disposed in the path of the radiation beam, acting as a shutter, such that no part of the substrate W receives radiation. This ensures that an adjacent target region is not exposed to radiation.

As a leading edge 106 of the target region 104 of the substrate W that is being exposed moves into the exposure region 102, the first masking blade B1 moves such that only the target region 104 receives radiation (i.e. no parts of the substrate outside of the target region 104 are exposed). That is, the masking blade B1 is disposed such that only the overlap between the exposure region 102 and the target region 104 receives radiation, as shown in FIG. 3B.

Figure 3C:
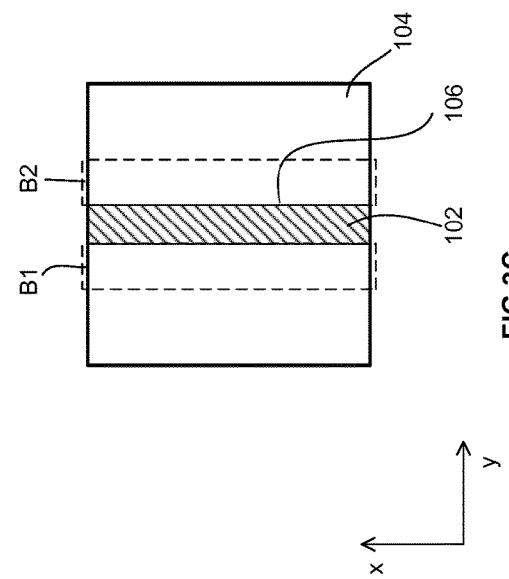

As shown in FIG. 3C, midway through the exposure of the target region 104 both masking blades B1, B2 are retracted out of the path of the radiation beam such that the entire exposure region 102 receives radiation. As the target region 104 of the substrate W moves out of the exposure region (i.e. an edge of the target region 104 passes the leading edge 106 of the exposure region 102), a second one of the masking blades B2 moves such that only the portion of the target region 104 that is disposed in the exposure region 102 receives radiation. This is illustrated in FIG. 3D.

The exposure region of the patterning device MA and the exposure region in a plane of the substrate W may be defined by the slit of radiation when the masking blades of the illuminator are not disposed in the path of the radiation beam PB.

Using the scan mode, the lithographic apparatus is operable to expose a target region C of the substrate W with substantially fixed area to radiation. For example, the target region C may comprise part of, one or several dies. A single wafer may be exposed to radiation in a plurality of steps, each step involving the exposure of a target region C followed by a movement of the substrate W. After exposure of a first target region C, the lithographic apparatus may be operable to move the substrate W relative to the projection system PL so that another target region C can be exposed to radiation. For example, between exposures of two different target regions C on the substrate W, the substrate table WT may be operable to move the substrate W so as to position the next target region so that it is ready to be scanned through the exposure region. This may be achieved, for example, by moving the substrate W so that the next target region is disposed adjacent to the exposure region 102.

Alternatively, the depicted apparatus can be used in another mode, wherein the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In order to ensure critical dimension uniformity (CDU) the dose of radiation delivered to each portion of the substrate W may be controlled to within a specification. Therefore, in general, it is desirable to have accurate control over the dose of radiation received by each point on the substrate W. For example, it may be desirable to control the dose sufficiently accurately that variation of the critical dimension of features formed on the substrate W is below a desired threshold. The dose may be defined as the amount of energy per unit area which is received by the substrate W.

During a scanning exposure, the lithographic apparatus projects radiation as a band of radiation on to the substrate W. The dose of radiation E(r) delivered to a point (at position r) on the substrate W is given by a time integral of the irradiance I(r,t) of the radiation for that point:

$$E(r) = \int_{t_1}^{t_2} I(r, t)dt, \quad (1)$$

where $t_1$ is the time at which a leading edge of the band of radiation passes position r and $t_2$ is the time at which a trailing edge of the band of radiation passes position r. The irradiance is the power received by the substrate W per unit area. The dose of radiation E delivered to an extended region on the substrate W is given by a surface integral of the dose E(r) over the extended region.

As can be seen from Eq. (1), the dose received by a given point on the substrate W is dependent on the time taken ($t_2-t_1$) for the band of radiation to pass that point. If the band of radiation moves over the substrate W at a generally constant velocity v then the time taken for the band of radiation to pass a given point is given by the ratio of the size of the band of radiation in the scanning direction to the velocity v.

The irradiance, which may vary with time, is the power received by the substrate W per unit area and is given by:

$$I(r,t) = P_{SO}(t) \times s(r,t) \times m(r), \quad (2)$$

where the $P_{SO}(t)$ is a power density of the radiation beam from radiation source SO; s(r,t) is a dimensionless distribution which describes a spatial intensity profile of the band of radiation output by the illuminator IL (i.e. the slit profile); and m(r) is a dimensionless distribution that represents the pattern imparted on the radiation beam by the patterning device MA. In the following discussion, for simplicity, the contribution to energy dose that arises from the pattern imparted on the radiation beam by the patterning device MA is ignored. Therefore in the following, the value of m is set at m=1.

The intensity profile s(r,t) of the band of radiation is dependent upon the optical components of the lithographic apparatus. In particular, the intensity profile s(r,t) is dependent upon the optics of the illuminator IL, including the slit aperture SA (as defined by the plurality of independently movable fingers F and the masking blades B). In general, a point r on the substrate W may be defined by two coordinates x, y. For example, coordinate y may define the position of r in the scanning direction and coordinate x may describe the position of r in a direction substantially perpendicular to the scanning direction.

The value of the dimensionless distribution s(r,t) may be dependent upon the position of r in a scanning direction (y) and may be independent of the position of r perpendicular to the scanning direction (x). For such embodiments, the profile of radiation may be described by a one dimensional function $f(y)$, which describes a general shape of the profile of the radiation in the scanning direction, evaluated at y=vt.

Alternatively, value of the dimensionless distribution s(r,t) may be dependent upon the position of r in both the scanning and non-scanning directions. For such embodiments, at each different position in the non-scanning direction the profile of radiation may be described by a different one dimensional function $f_x(y)$, which describes a general shape of the profile of the radiation in the scanning direction, evaluated at y=vt.

Figure 4:
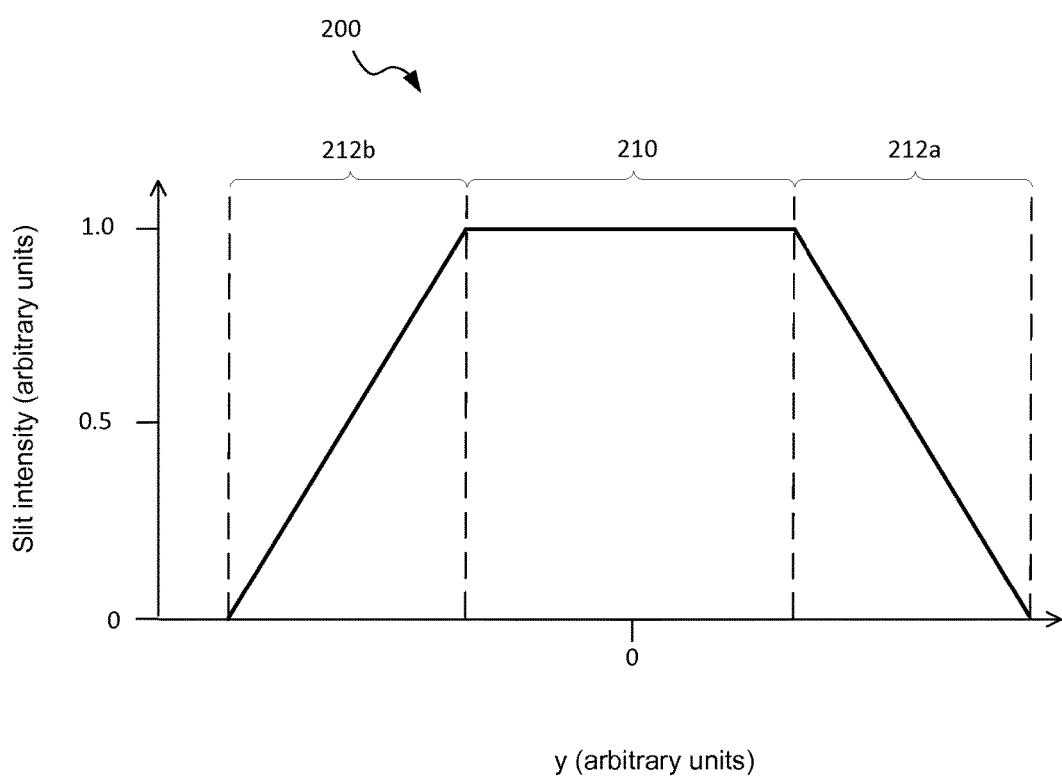
FIG. 4 shows an example slit profile of a band of radiation beam as a function of a scanning direction.

The profile of the band of radiation in the scanning direction may have any convenient shape such as, for example, a 'top-hat' shape, a trapezoid like shape, or a truncated Gaussian (or 'Gaussian-like') shape. The intensity profile of the band of radiation in the scanning direction may comprise a generally flat central portion such that the majority of the pulses of radiation that hit each point on the substrate W contribute approximately the same amount to the dose received by that point. Furthermore, the intensity profile of the band of radiation in the scanning direction may fall to zero gradually on either side of the central flat portion, which may make the dose of radiation delivered to each point on the substrate W less sensitive to the phase of the radiation pulse train as the given point passes the leading edge of the profile, i.e. the amount of time which passes between the given point passing the leading edge of the profile and the first pulse irradiating it. FIG. 4 shows an example slit profile 200 as a function of the scanning direction y. The slit profile 200 comprises a central portion 210 between two side portions 212a, 212b. In the central portion 210 the intensity is constant. On either side of the central portion 210 the intensity falls linearly to zero in the two side portions 212a, 212b. Therefore, the shape of the slit profile 200 is an isosceles trapezoid. It will be apparent that other shapes may alternatively be used. For example, the profile may be more rounded than a trapezium.

From Eq. (1) it can be seen that when no mask MA is present (i.e. m=1) the dose E(y) received by a point (position y) on the substrate is given by a convolution of the profile of the band of radiation and the power density of the radiation source.

The radiation source SO may produce a radiation beam which is pulsed with a pulse frequency $f_p$. For example, the radiation source SO may comprise a laser (e.g. an excimer laser) which produces a pulsed radiation beam having a pulse frequency $f_p$. For such an arrangement, the dose of radiation which is received by a given point on the substrate W is a sum (over all pulses which irradiate that given point) of the doses of radiation delivered by each pulse. The number of pulses which contribute to the dose for a given point is dependent upon: the time taken for that point to sweep past the band of radiation; the pulse frequency $f_p$; and the phase of the radiation pulse train as the given point passes the leading edge of the profile, i.e. the amount of time which passes between the given point passing the leading edge of the profile and the first pulse irradiating it.

For embodiments utilising a pulsed radiation source SO, the power density of the radiation beam will be dependent upon the pulse train of the radiation source. For example, the power density of the radiation beam may be given by:

$$P_{SO}(t)=P(t)\times p(t), \quad (3)$$

where P(t) is an amplitude of the power density of the radiation source and p(t) is a dimensionless pulse waveform. P(t) may be viewed as the power density of an equivalent continuous radiation source and the pulse waveform describes how this is sampled at the pulse frequency $f_p$. The pulsed radiation may have any pulse train. The shape, duration and frequency of the pulses may be chosen as desired or required. The pulse frequency may, for example, be around 6 KHz, which is equivalent to a pulse time period of around 0.17 ms (although other pulse frequencies may be used).

The duration of the pulses may be significantly smaller than the time period of the pulse train. For such embodiments, p(t) may be approximated by a sum of Dirac delta functions of the form $\delta(t-t_i)$, where $t_i$ is the time at which the ith pulse irradiates the substrate W. With this approximation, from Eqs. (1) and (3), the dose of radiation E(r) delivered to a point (at position r) on the substrate W is given by:

$$E(r) = \sum_i P_i \times s(r, t_i), \quad (4)$$

where the sum is over all pulses that hit the position r, i.e. all pulses that occur between the time $t_1$ at which a leading edge of the band of radiation passes position r and the time $t_2$ at which a trailing edge of the band, and $P_i$ is the power density of the ith pulse. The ratio of the time period of the pulse train to the duration of the pulses may, for example, be of the order of 1000 (or may be some other value). The duration of the pulses may, for example, be around 150 ns (although other pulse durations may be used).

From Eq. (4) it can be seen that, the dose delivered to each point on the substrate is dependent on both: (a) the power of the radiation source SO; and (b) the shape of the slit profile produced by the illuminator IL. Therefore, the dose of radiation delivered to the substrate W may be controlled by controlling one or both of the power of the radiation source SO and the shape of the slit profile produced by the illuminator IL. In some embodiments, in order to control the dose of radiation delivered to each point on the substrate W, the output power of the radiation source SO is controlled using a feedback loop that comprises a controller CN and radiation sensor RS, as described further below. The output power of the radiation source SO may be controlled in real time using this feedback loop while the slit profile remains fixed. With such an arrangement, in order to determine the actual dose of radiation that is delivered to each point on the substrate W (or ensure that a desired dose is delivered to each point on the substrate W), the controller CN may require some information regarding the slit profile. Therefore, before a substrate W is exposed to radiation in the lithographic apparatus, a calibration method is performed to measure information related to the slit profile. This information can be used by the radiation sensor RS and/or the controller CN to ensure that a desired dose of radiation is delivered to each part of the substrate W. An embodiment of such a calibration method and the apparatus associated therewith will be described more fully below.

A feedback loop comprising the controller CN, the radiation sensor RS and the radiation source SO for controlling the dose of radiation delivered to each point on the substrate W is now described.

A power $P_i$ of each pulse of radiation may be measured by radiation sensor RS. The radiation sensor RS may be any sensor suitable for measuring the energy of radiation incident upon the radiation sensor RS. For example the radiation sensor RS may be a photodiode. The radiation sensor RS may be positioned such that at least a portion of the radiation beam produced by the radiation source SO is incident upon the radiation sensor RS. For embodiments wherein only a portion of the radiation beam produced by the radiation source SO is incident upon the radiation sensor RS, the relationship between the dose received by the radiation sensor RS and the dose received by the substrate W should be known so that the latter can be determined from a measurement of the former.

An example positioning of the radiation sensor RS is depicted in FIG. 1. A partially transmissive mirror 110 is positioned in the illuminator IL. The partially transmissive mirror 110 reflects a first portion 111 of the radiation beam onto the radiation sensor RS. The remainder 112 of the radiation beam is transmitted by the partially transmissive mirror 110 and passes to the patterning device MA. The fraction of the radiation beam which is reflected by the partially transmissive mirror 110 (the first portion 111) may for example be of the order of a few percent or less of the radiation beam. If this fraction is known, the energy of the radiation beam 112 which is transmitted by the partially transmissive mirror 110 may be calculated using measurements made by the radiation sensor RS. If the fraction is not known, the radiation sensor RS may be calibrated with a second radiation sensor (not shown) by replacing the substrate with the second radiation sensor and comparing the energy measured by both radiation sensors.

It will be appreciated that in other embodiments the partially transmissive mirror 110 and the radiation sensor RS may be located at other positions along the path of the radiation beam. For example the partially transmissive mirror 110 and the radiation sensor RS may be positioned before the illuminator IL (e.g. in the beam delivery system).

The controller CN is configured to output a control signal to the radiation source SO (e.g. laser), which control signal may be used to control one or more variables of the radiation source SO.

A mechanism by which the energy or power of each pulse of a pulsed laser beam output by a laser may be adjusted is now described. Energy is supplied to the radiation source SO. For example, for embodiments wherein the radiation source is a laser, energy may be supplied to the gain medium of the laser by an external source. This process is known as pumping, and the external source may comprise: an electrical power supply (electrical pumping), electromagnetic radiation (optical pumping), gas flow (gas dynamic pumping), or some other suitable energy source. The external power source may be adjustable, so that the amount of pump power supplied to the gain medium can be varied. The external power source may be provided with one or more input variables that can be varied so as to vary the power supplied to the gain medium. For example, in the case of a gas laser such as an excimer laser the external power source may comprise a pair of discharge conductors across which a high voltage is applied. For such embodiments, the power supplied to the gain medium can be varied by varying the voltage applied across the conductors. In the case of a gas discharge lamp such as a mercury lamp the external power source may comprise a pair of main electrodes across which a voltage is applied to establish and maintain an electric arc. For such embodiments, the power supplied to the gain medium can be varied by varying the voltage applied across the main electrodes.

In general, the power of the laser beam will be dependent upon the pump power supplied by the external power source. If a relationship between the one or more variables of the external power supply (e.g. a high voltage applied across a pair of discharge conductors) and the power of the beam is known, a desired power may be achieved by choosing the values of the variables accordingly. The relationship may be parameterized as a polynomial with one or more free parameters that may be determined during a calibration method.

Furthermore, the relationship may vary with time and therefore it may be necessary to perform a calibration periodically.

For example, in the case of an excimer laser the power of the laser is dependent upon the high voltage V applied across the two conductors. In general, this relationship is non-linear. However, for a range of voltages V that are used in practice, a power P of the laser may be well approximated by a polynomial expansion of the voltage V. For a sufficiently small range of voltages V, the relationship between the power P and the voltage may be approximated by a linear relationship:

$$P = O + G \times V, \tag{5}$$

where the gain G and the offset O of the laser are parameters which can be determined during a calibration method. For larger ranges of voltage, a higher order polynomial with more tuneable parameters may be necessary to parameterize the relationship between the voltage V and the power P.

In practice, the output power P of the radiation source SO (e.g. as measured by a radiation sensor) will include an element of noise. Therefore the calibration method may use data from an extended time period to evaluate the parameters used in the relationship between the one or more variables of the external power supply and the power. The values of the parameters may drift with time as the lithography apparatus is operating, and therefore the parameters may be determined periodically using the calibration method.

The above described feedback loop formed by the radiation source SO, the radiation sensor RS and the controller CN provides control over the dose delivered to the substrate W. As explained above, the dose delivered to each point on the substrate is dependent on both: (a) the power of the pulses of radiation produced by the radiation source SO; and (b) the shape of the slit profile produced by the illuminator IL. In order to control the power of the radiation source SO such that a desired dose is delivered to the substrate W some information regarding the slit profile may be used. For example, it may be desirable to use the integral of the slit profile across the scanning direction or, equivalently, the average value of the slit profile across the scanning direction. During exposure of a substrate W, the feedback loop can be used to adjust the radiation source SO so as to ensure that the dose remains at a substantially constant value. The information regarding the slit profile (e.g. the integral of the slit profile across the scanning direction or, equivalently, the average value of the slit profile across the scanning direction) can be used to ensure that the substantially constant level is a desired value, or within a range of desired values.

Before a substrate W is exposed to radiation in the lithographic apparatus, a calibration method is performed to measure information related to the slit profile, as now described. The calibration method may be performed once directly before exposure of each substrate W. Alternatively, the calibration method may be performed once every N wafers, i.e. the calibration may be performed and, subsequently, a plurality of substrates may be exposed before the calibration method is repeated.

The isolated frame MF may be considered to be a reference frame for the calibration method.

During the calibration method, a calibration sensor CS is disposed on the substrate table WT. The calibration sensor CS may be any sensor suitable for measuring the energy of radiation incident upon the calibration sensor CS. For example the calibration sensor CS may be a photodiode. In FIG. 1, a substrate W is shown on the substrate table WT and calibration sensor CS is shown schematically in a storage position adjacent to the substrate table WT. It will be appreciated that a mechanism is provided to move the calibration sensor CS between the storage position (where it is disposed during exposure of a substrate W) and an operational position on the substrate table WT.

For the calibration method, no patterning device MA is disposed on the support structure MT. The radiation beam PB exiting the illuminator IL therefore passes unaltered through the projection system PL, which focuses the beam onto an exposure region in a substrate plane at, or adjacent to, the substrate table WT. The substrate plane may be stationary with respect to frame MF.

The second positioning device PW and position sensor IF are used to move the substrate table WT accurately relative to the frame MF, so as to move the calibration sensor CS through the beam of radiation in the substrate plane along a scan trajectory. The second positioning device PW may therefore be considered to be a scanning mechanism operable to move the calibration sensor CS relative to the frame MF. The scan trajectory may be a linear trajectory aligned with the scanning direction Y of the lithographic apparatus. The calibration sensor CS may move along the scan trajectory at a substantially constant scan velocity. During the calibration method, the calibration sensor CS may move at any scan velocity $v_{WT}$ relative to the frame MF. This scan velocity $v_{WT}$ may, for example, be different to the scan velocity used for exposure of the substrate W. For example, a lower scan speed may be used for the calibration method than is used for exposure of a substrate W. In one embodiment, the scan speed may be such that the calibration sensor CS receives of the order of 240 pulses of radiation.

The calibration sensor CS comprises at least one sensing element. In one embodiment, the calibration sensor comprises a single sensing element. The single sensing element may be disposed at any convenient position in the non-scanning direction (i.e. the X direction of FIG. 1). For example, the single sensing element may be disposed at a non-scanning position that corresponds to, or is close to, a mid-point along the length of the slit. Alternatively, in other embodiments the calibration sensor may comprise an array of sensing elements. For example, the calibration sensor may comprise a one-dimensional array of sensing elements which extends along the non-scanning direction such that each of the sensing elements is disposed at a different position in the non-scanning direction.

The calibration sensor CS comprises an opaque substrate and the single sensing element comprises an aperture in said opaque substrate. The single sensing element further comprises a sensor disposed behind the aperture. The aperture in the opaque substrate may have a diameter of the order of 100 µm.

As the sensing element moves through the exposure region, it is exposed to radiation. Once it has moved through the whole exposure region, it will have received a dose of radiation given by Eq. (4). That is, the sensing element will receive a plurality of individual doses of radiation, each individual dose of radiation corresponding to a different one of the pulses of radiation that irradiate the sensing element. Each sensing element is operable to measure the individual dose of radiation that is received by a region on the substrate table WT that is in a focal plane of the projection system PL from each pulse of radiation during the time that it traverses the exposure region. $ID_i$ is the individual dose of radiation that is received by a region on the substrate table WT that is in a focal plane of the projection system PL from the ith pulse of radiation. Each sensing element is operable to output a signal to controller CN which is indicative of the individual dose of radiation $ID_i$ that is received from each pulse of radiation.

Embodiments of the invention are provided with a mechanism operable to determine a quantity indicative of a velocity $v_{IL}$ of the illuminator IL relative to the frame MF, as will be described below.

Embodiments of the invention involve determining information related to a spatial intensity distribution of the radiation beam (i.e. the slit profile) in the substrate plane in dependence on: (a) an output of the calibration sensor CS; (b) the scan trajectory of the sensor (e.g. the scan velocity $v_{WT}$); and (c) the quantity indicative of the velocity $v_{IL}$ of the illumination system relative to the frame MF. As each pulse of radiation illuminates the calibration sensor CS, the individual dose of radiation $ID_i$ that is received by calibration sensor CS is dependent of the position of the calibration sensor relative to the band of radiation when the pulse illuminates the calibration sensor CS. Therefore, with each pulse of radiation the calibration sensor CS may be considered to sample of the slit profile (or at least information relating thereto) at a different position in the scanning direction. Any movement of the illumination system relative to the frame MF will affect the sampling of the slit profile by the calibration sensor CS, in particular it will affect the positions (in the scanning direction) of the points within the slit profile that are sampled. By using the quantity indicative of the velocity $v_{IL}$ of the illumination system relative to the frame MF in the determination of the information related to a spatial intensity distribution of the radiation beam in the substrate plane, any such movement of the illumination system IL relative to the frame MF can be taken into account. In the example embodiment shown in FIG. 1, the calibration method is carried out by controller CN. That is, it is controller CN which is operable to determine the information related to a spatial intensity distribution of the radiation beam (i.e. the slit profile) in the substrate plane.

The individual dose $ID_i$ corresponding to the ith pulse of radiation is the product of the power $P_i$ of that pulse and the intensity of the slit profile $f(y_i)$ at the point $y_i$ in the scanning direction that the sensing element is at when that pulse illuminates the sensing element. The method may further comprise determining a power of each pulse of radiation provided by the illumination system IL that is received by the calibration sensor. The information related to a spatial intensity distribution of the radiation beam in the plane may also be determined in dependence on the power of pulses of radiation provided by the illumination system.

In some embodiments, the information related to a spatial intensity distribution of the radiation beam (i.e. the slit profile) in the substrate plane may comprise: (i) a plurality of intensities within the slit; and (ii) a quantity indicative of a position in the slit that corresponds to each of the plurality of intensities. Effectively, such embodiments involve sampling the slit profile a plurality of times and simultaneously determining how the slit profile has been sampled. From such information the integral of the slit profile across the scanning direction or, equivalently, the average value of the slit profile across the scanning direction may be determined, as will be explained more fully below.

The plurality of intensities may be determined in dependence on the output of the calibration sensor CS. For example, each of plurality of intensities may be proportional to one of the individual doses of radiation $ID_i$ that are received by each sensing element. The plurality of intensities may also be determined in dependence on the output of the radiation sensor RS. For example, the ith intensity may be proportional to the ratio of one of the individual doses of radiation $ID_i$ corresponding to the ith pulse of radiation (as determined by the calibration sensor CS) to the power $P_i$ of the ith pulse of radiation (as determined by the radiation sensor RS).

The quantity indicative of a position in the slit that corresponds to each of the plurality of intensities may be determined in dependence on: the scan trajectory of the sensor (e.g. the scan velocity $v_{WT}$); and the quantity indicative of the velocity $v_{IL}$ of the illumination system relative to the frame MF.

To first order approximation, the velocity v at which the calibration sensor CS moves relative to the band of radiation is given by the scan velocity $v_{WT}$ (i.e. the velocity of the substrate table WT relative to the frame MF). Any movement of the illuminator IL relative to the frame MF in the scanning direction will result in a moving band of radiation in the substrate plane of the frame MF. Therefore such movement of the illuminator affects the velocity v at which the calibration sensor moves relative to the band of radiation. As a consequence, the samples of the slit profile (band of radiation) by the calibration sensor CS on the substrate table WT are not equally spaced in the scanning direction. Any vibration of the illuminator IL modulates the regularity of the sampling of the slit profile by the calibration sensor CS. This is illustrated in FIGS. 5A and 5B.

Figure 5A:
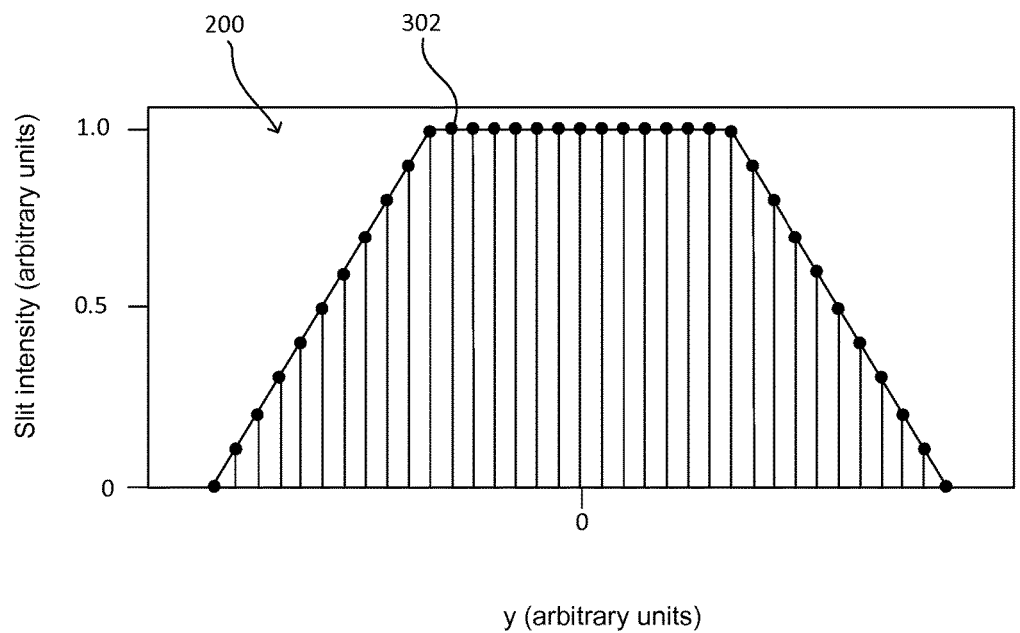
FIG. 5A shows the example slit profile of a band of radiation beam as a function of a scanning direction as shown in FIG. 4 and a plurality of dots, each representing a position in the scanning direction of a calibration sensor (relative to the band of radiation) when a pulses of radiation irradiates the calibration sensor when the illuminator of the lithographic apparatus is stationary with respect to a reference frame.
Figure 5B:
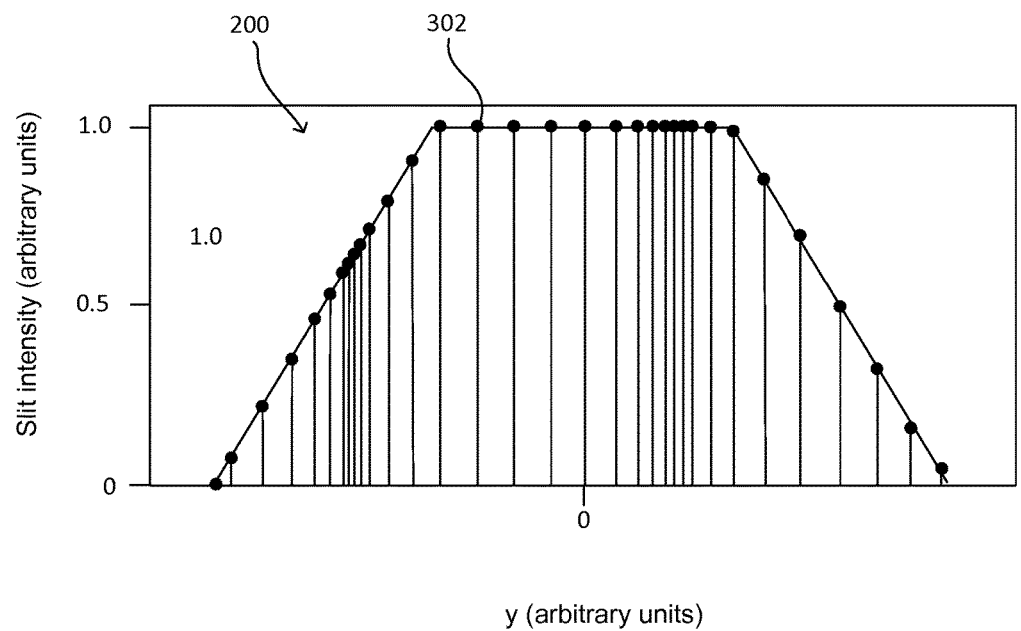
FIG. 5B shows the example slit profile of a band of radiation beam as a function of a scanning direction as shown in FIG. 4 and a plurality of dots, each representing a position in the scanning direction of a calibration sensor (relative to the band of radiation) when a pulses of radiation irradiates the calibration sensor when the position of the illuminator of the lithographic apparatus is oscillating relative to the reference frame.

FIGS. 5A and 5B both show an example slit profile 200 as a function of the scanning direction y, slit profile 200 being substantially as described above with reference to FIG. 4. Overlaid on slit profile 200 are a plurality of dots 302, each of which represents a position in the scanning direction y of the calibration sensor CS (relative to the slit) when one of the pulses of radiation irradiates the calibration sensor CS. FIG. 5A illustrates a scenario wherein the calibration sensor CS moves at a scan velocity $v_{WT}$ in the scanning direction relative to frame MF, the illuminator is stationary with respect to frame MF (i.e. $v_{IL}=0$) and the pulse frequency $f_p$ of the radiation source SO is constant. Under such conditions, the spacing of the dots 302 in the y direction is constant. The spacing $\Delta y$ between each pair of successive dots 302 is given by the ratio of the scan velocity $v_{WT}$ to the pulse frequency $f_p$, i.e. $\Delta y = v_{WT}/f_p$.

FIG. 5B illustrates a scenario wherein the calibration sensor CS moves at a scan velocity $v_{WT}$ in the scanning direction relative to frame MF and the pulse frequency $f_p$ of the radiation source SO is constant but the position of the illuminator IL relative to frame MF is oscillating. Under such conditions, the spacing of the dots 302 in the y direction is not constant but is moderated by the oscillation of the illuminator IL. The spacing $\Delta y$ between each pair of successive dots 302 is given by the ratio of the velocity v of the calibration sensor CS relative to the band of radiation to the pulse frequency $f_p$, i.e. $\Delta y = v/f_p = |v_{WT} + v_{IL}|/f_p$.

By determining both: (i) a plurality of intensities within the slit; and (ii) a quantity indicative of a position in the slit that corresponds to each of the plurality of intensities, embodiments of the invention both sample the slit profile and simultaneously determine how the slit profile has been sampled. In this way, information relating to the slit profile can be determined despite non-equidistant sampling of the slit in the scanning direction.

How the slit profile is sampled in the scanning direction y is dependent on: the scan trajectory of the sensor (e.g. the scan velocity $v_{WT}$) and the quantity indicative of the velocity $v_{IL}$ of the illumination system relative to the frame MF, along with the pulse frequency $f_p$ of the radiation source SO. The distance in the scanning direction that the calibration sensor CS moves between irradiation by two successive pulses of radiation is given by the ratio of the magnitude of the velocity v of the calibration sensor CS relative to the band of radiation in the scanning direction to the pulse frequency $f_p$ of the radiation source SO.

During the calibration method, the velocity v at which the calibration sensor moves relative to the band of radiation is given by the (vector) sum of the scan velocity $v_{WT}$ and the instantaneous velocity $v'_{IL}$ of the radiation beam PB in the scanning direction, relative to the isolated frame MF and in the plane of the substrate table WT. The instantaneous velocity $v'_{IL}$ of the radiation beam PB in the scanning direction, relative to the isolated frame MF and in the plane of the substrate table WT is dependent on the velocity of the illuminator $v_{IL}$ and the demagnification and image reversal characteristics of the projection system PL. If the characteristics of the projection system PL are such that the image of the patterning device MA that is formed in the plane of the substrate W is inverted in the scanning direction then velocity $v'_{IL}$ will have an opposite sign to velocity $v_{IL}$ (i.e. in the plane of the substrate table WT the band of radiation will move in the opposite direction to the illuminator IL). Further, if the projection system PL applies a reduction factor α to the radiation beam PB then the magnitude of velocity $v'_{IL}$ will be less than that of velocity $v_{IL}$ by a factor of α. Therefore, for a projection system that inverts the image and applies a reduction factor α, the velocity $v'_{IL}$ is given by $-v_{IL}/\alpha$.

In some embodiments, the information related to a spatial intensity distribution of the radiation beam (i.e. the slit profile) in the substrate plane may be the integral of the slit profile across the scanning direction or, equivalently, the average value of the slit profile across the scanning direction. Such an integral or average may for example be determined by calculating a weighted sum of the plurality of intensities. The weight may be proportional to a (vector) sum of the scan velocity of the calibration sensor CS and the instantaneous velocity of the radiation beam PB in the scanning direction, relative to the isolated frame MF and in the plane of the substrate table WT. Furthermore, the weight may be inversely proportional to the pulse frequency $f_p$ of the radiation source. Such a weight is proportional to the distance in the scanning direction that the calibration sensor CS has moved between irradiation by two successive pulses of radiation. Therefore, such embodiments provide a numerical estimate of the integral of the slit profile across the scanning direction based on a rectangle method of integration.

As explained above, in some embodiments the ith intensity may be proportional to the ratio of the individual dose of radiation $ID_i$ corresponding to the ith pulse of radiation to the power $P_i$ of the ith pulse of radiation. The power $P_i$ of the ith pulse of radiation is measured by the radiation sensor RS disposed in the illuminator IL. By taking the ratio of the individual dose $ID_i$ corresponding to the ith pulse of radiation (as determined by the calibration sensor CS) to the power $P_i$ of the ith pulse of radiation (as determined by the radiation sensor RS), any dependence on the output power of the radiation source SO can be effectively factorized away so that the intensity of the slit profile $f(y_i)$ may be determined. In particular, the intensity of the slit profile $f(y_i)$ may be determined at the point in the scanning direction that the sensing element is at when that pulse illuminates the sensing element. In this way, during the calibration method, the slit profile $f(y)$ can be sampled a plurality of times across the slit. Any variation in the output power of the radiation source SO over the pulses of radiation that are received by the calibration sensor CS has effectively been removed.

In one particular embodiment of the invention, the calibration method involves the determination of a factorized slit integrated energy U, given by:

$$U = \sum_i \frac{ID_i}{P_i} \frac{|v_{WT} + v'_{IL}|}{f_p}. \quad (6)$$

In this context, 'factorized' refers to the fact that variations in pulse power have been removed or 'factorized' away by dividing by the power of each pulse $P_i$ (as explained above). The factorized slit integrated energy U is an estimate of the integral of the slit profile across the scanning direction. Since the factorized slit integrated energy U is determined from measurements from the radiation sensor RS and the calibration sensor CS (on the substrate table WT), it describes the optics between the radiation sensor RS in the illuminator IL and the substrate table WT. Further, the factorized slit integrated energy U takes into account relative motion of the illuminator IL and the frame MF.

If the factorized slit integrated energy U did not take into account the motion of the illuminator IL, then it would, in general, be a less accurate estimate of the integral of the slit profile in the scanning direction. Such a scenario would result from setting $v'_{IL}=0$ in Eq. (6). In this case, the factorized slit integrated energy U would in general be dependent on the phase of the oscillation of the illuminator IL as the calibration sensor passes the leading edge of the slit and enters the exposure region. For some phases, the factorized slit integrated energy U may be unaffected by setting $v'_{IL}=0$ in Eq. (6). However, for other phases the difference between the factorized slit integrated energy U and the true integral of the slit profile in the scanning direction may be significant. In turn, since the factorized slit integrated energy U is used by the controller CN to ensure a given dose of radiation is delivered during exposure of a substrate W, such a difference will result in an error in the dose delivered to each part of the substrate W. This will therefore affect the image of the patterning device that is imparted to the substrate W.

As described above, the determination of the factorized slit integrated energy U using Eq. (6) is merely one embodiment of the calibration method. In general, the calibration method samples the slit intensity at a plurality of different points in the scanning direction and determines the position of each of the plurality of different points in the scanning direction. Eq. (6) is one way in which the integral of the slit profile can be estimated from this information. However, it will be apparent to one skilled in the art that alternative methods may be used to estimate the integral of the slit profile from this information. For example, by summing up the distances $\Delta y$ (where $\Delta y = |v_{WT} + v_{IL}|/f_p$) between each pair of successive samples from one side of the slit to a given sample, the absolute position of a sample may be determined. The intensity of the slit profile may then be determined at a number of equally spaced positions in the scanning direction using interpolation and the factorized slit integrated energy U may be calculated from these interpolated intensities. Alternatively, a parameterisation of a slit profile (which may be either theoretical or calibrated) may be fitted to the sampled points and the integral of the slit profile may be determined from the parameterisation of a slit profile.

The above described calibration method takes into account movement of the illuminator IL relative to frame MF. Such movement of the illuminator IL may occur, for example, during operation of the lithographic apparatus in the scan mode. This is because in the scan mode the support structure MT and the substrate table WT may undergo rapid accelerations and decelerations, which in turn may exert large forces on the base frame BF by which they are supported via the isolated frame MF. These induced forces are partially compensated by counter-moving balance masses but this compensation is not perfect and therefore some residual forces are exerted on the base frame BF. The residual forces on the base frame BF induce vibrations of the base frame BF. Although the illuminator IL may not be directly mounted on to the base frame BF, it is connected thereto and there is some physical coupling between the base frame BF and the illuminator IL. Therefore, the vibrations of the base frame BF are to some extent transmitted to illuminator IL (and other components that are directly or indirectly coupled on the base frame BF). This results in vibrations of the illuminator IL, in general in all directions and in particular in the scanning direction. Such vibrations of the illuminator IL in the scanning direction result in a vibrating band of radiation in the planes of the patterning device MA and the substrate W.

The typical motion depends on the stiffness tensor of a supporting floor (which supports base frame BF) and the motion that is executed by the support structure MT and the substrate table WT (or both substrate tables WT for a dual stage lithographic apparatus). In particular, the amplitude of the vibrations of the illuminator IL is dependent upon: the motion that is executed by the support structure MT and the substrate table WT; and the coupling between the illuminator IL and the base frame BF.

An example embodiment of a mechanism operable to determine a quantity indicative of a velocity of the illuminator IL relative to the frame MF is now described. In the embodiment shown in FIG. 1, an accelerometer AC is mounted on the illuminator IL. The accelerometer AC may be mounted close to the slit aperture SA of the illuminator IL formed by the fingers F and the masking blades B. The accelerometer AC is operable to measure the acceleration of the illuminator IL relative to the frame MF in the scanning direction. The measured acceleration is integrated over a resolution time, to calculate the instantaneous average velocity of the illuminator IL (in the vicinity of the slit aperture SA) in the scanning direction during said resolution time.

In FIG. 1, accelerometer AC is operable to measure the acceleration of the illuminator IL relative to the frame of reference of the Earth. In some embodiments, a second accelerometer (not shown) may be mounted on the frame MF, which may be operable to measure the acceleration of the frame MF relative to the frame of reference of the Earth. In combination, the accelerometer AC mounted on the illuminator IL and the accelerometer mounted on the isolated frame MF can be used to determine the acceleration of the illuminator IL relative to the frame MF (in the scanning direction). However, as discussed above, in order to perform precision lithography, the frame MF is likely to be very well mechanically isolated from its surroundings by way of acoustically damping mounts DM, and therefore may be assumed to be at rest relative to the frame of reference of the Earth. A single accelerometer AC may therefore be used to determine the acceleration of the illuminator IL relative to the frame MF.

In one embodiment, accelerometer AC comprises three separate accelerometers that are each mounted close to the slit aperture SA of the illuminator IL. This allows the acceleration (and the velocity) of the illuminator IL in the scanning direction (into the page in FIG. 1) to be decomposed into: a component that corresponds to linear motion of the illuminator IL in the scanning direction; a component that corresponds to rotations of the illuminator IL around the Z axis (see FIG. 1); and a component that corresponds to rotations of the illuminator IL around the X axis (see FIG. 1). The components that correspond to rotations of the illuminator IL around the X and Z axes do not contribute to the velocity of the band of radiation that sweeps over the substrate W (but do affect the size of the exposure region) and may therefore be discarded. Therefore, it may be that only the component that corresponds to linear motion of the illuminator IL in scanning direction is used to determine how the power of the radiation beam PB should be modulated.

The accelerometer AC is operable to determine the acceleration of the illuminator IL in the scanning direction relative to the frame MF and to output a signal indicative thereof to a controller CN (shown in FIG. 1). The controller CN may comprise a microprocessor. The controller CN may be configured to integrate the measured acceleration over a resolution time to calculate the average velocity of the illuminator $v_{IL}$ in the scanning direction during said resolution time.

Alternatively, the accelerometer AC may be configured to integrate the measured acceleration over a resolution time to calculate the average velocity of the illuminator $v_{IL}$ in the scanning direction during said resolution time. The accelerometer AC may be further operable to output a signal indicative of the average velocity of the illuminator $v_{IL}$ in the scanning direction during said resolution time to the controller CN.

The rate at which the instantaneous velocity $v'_{IL}$ of the radiation beam PB (or, equivalently, the velocity $v_{IL}$ of the illuminator IL in the vicinity of the slit aperture SA) is determined should be higher than the typical frequency of the vibrations of the illuminator IL relative to the frame MF. Due to the nature of the coupling between the illuminator IL and the frame MF, the frequency of any induced vibration of the illuminator IL may be relatively low. For example, only frequencies below 80 Hz, and in some embodiments only frequencies below 30 Hz, may be excited. The sample rate of the accelerometer AC may be, for example, of order 100-200 Hz. For embodiments wherein the radiation source SO produces a pulsed beam of radiation, the rate at which the instantaneous velocity of the illuminator $v_{IL}$ is determined does not need to be as high as the repetition rate of the radiation source SO, which may be of the order of a few kiloHertz. For pulses of radiation generated between two determinations of the velocity of the illuminator $v_{IL}$ by the accelerometer AC, the velocity of the illuminator $v_{IL}$ may be estimated using interpolation or extrapolation. The above described embodiment uses a single controller CN which is operable to both: (a) control the radiation source SO is part of a feedback loop during exposure of a substrate W; and (b) perform the calibration method, which involves the determination of information relating to the spatial intensity distribution of the radiation beam. However, alternative embodiments may use separate controllers for these two functions.

In the above disclosure a feedback loop comprising the controller CN, the radiation sensor RS and the radiation source SO is used to control the dose of radiation delivered to each point on the substrate W. In some embodiments, as part of this feedback loop, the controller CN may be operable to take into account any movement of the illumination system IL relative to the frame MF in real time during exposure of a substrate W. To achieve this, controller CN may use the quantity indicative of the velocity $v_{IL}$ of the illumination system relative to the frame MF, as described above.

Although the above described embodiment uses an accelerometer AC mounted on the illuminator IL to determine an instantaneous velocity of the slit SL in the scanning direction other mechanisms operable to determine a quantity indicative of a velocity of the illuminator relative to the frame may alternatively be used. For example, one such mechanism may comprise a camera mounted on the frame MF which is operable to directly measure the movement of the band of radiation relative to the frame MF.

The power of a radiation beam is the rate at which it supplies energy. Power has units of energy per unit time (for example W). The irradiance of a radiation beam incident upon a surface is the power of the radiation beam per unit area that is incident upon that surface. Irradiance has units of energy per unit time per unit area (for example $Wm^{-2}$). In the above disclosure, the terms "power" and "irradiance" may be used interchangeably, the meaning being clear from the context of the use.

In the above disclosure, the amount of energy per unit area which is received by a substrate W may be referred to interchangeably as the "dose of radiation", the "dose of energy", the "energy dose" or the "dose".

Whilst the radiation source SO has been described as comprising a laser, the radiation source SO may be any form of radiation source SO. For example the radiation source SO may be an EUV radiation source (e.g. a discharge produced plasma source, a laser produced plasma source or a free electron laser) or a lamp type light source (e.g. a mercury discharge lamp).

Although an embodiment of the invention has been described above in the context of a DUV lithographic apparatus employing transmissive optics, it is also applicable to EUV lithographic apparatuses using reflective optics.

While specific embodiments of the invention have been described above, it will be appreciated that the invention may be practiced otherwise than as described. The description is not intended to limit the invention.

The invention claimed is:

1. A method comprising:
providing a pulsed radiation beam using an illumination system;
projecting the pulsed radiation beam onto a region of a plane in a reference frame;
using a scanning mechanism to move a calibration sensor relative to the reference frame such that the calibration sensor moves through the beam of radiation in the plane along a scan trajectory;
determining a quantity indicative of a velocity of the illumination system relative to the reference frame; and
determining information related to a spatial intensity distribution of the radiation beam in the plane in dependence on: (a) an output of the calibration sensor; (b) the scan trajectory of the calibration sensor; and (c) the quantity indicative of a velocity of the illumination system relative to the reference frame.

2. The method of claim 1, wherein the quantity indicative of a velocity of the illumination system relative to the reference frame is an acceleration of the radiation system in a scanning direction and further comprising integrating the acceleration over a resolution time to calculate an average velocity of the illumination system in the scanning direction during the resolution time.

3. The method of claim 1, further comprising determining a power of each pulse of radiation provided by the illumination system, wherein the information related to a spatial intensity distribution of the radiation beam in the plane is also determined in dependence on the power of pulses of radiation provided by the illumination system.

4. The method of claim 1, wherein the information related to a spatial intensity distribution of the radiation beam in the plane comprises: (i) a plurality of determined intensities; and (ii) a quantity indicative of a position in the radiation beam that corresponds to each of the plurality of intensities.

5. The method of claim 4, wherein each of the plurality of intensities is proportional to an individual dose of radiation that is received by a sensing element of the calibration sensor.

6. The method of claim 4, wherein each of the plurality of intensities is proportional to a ratio of the individual dose of radiation that is received by a sensing element of the calibration sensor from a pulse of the pulsed radiation beam to the power of that pulse of radiation.

7. The method of claim 4, wherein the quantity indicative of a position in the radiation beam that corresponds to each of the plurality of intensities is determined in dependence on: the scan trajectory of the calibration sensor, and the quantity indicative of a velocity of the illumination system relative to the reference frame.

8. The method of claim 7, wherein the quantity indicative of a position in the radiation beam that corresponds to each of the plurality of intensities comprises a spacing in a scanning direction between that corresponding intensity and an adjacent intensity.

9. The method of claim 8, wherein the spacing in the scanning direction is given by a ratio of the magnitude of a vector sum of a scan velocity of the calibration sensor and the instantaneous velocity of the radiation beam in the scanning direction relative to the reference frame and in the plane to a pulse frequency of the radiation source.

10. The method of claim 8, wherein the quantity indicative of a position in the radiation beam that corresponds to each of the plurality of intensities comprises a sum of the spacings in a scanning direction between each intensity and an adjacent intensity from one side of the radiation beam to the corresponding intensity.

11. The method of claim 1, wherein the information related to a spatial intensity distribution of the radiation beam in the plane is proportional to an estimate of an integral of the intensity distribution of the radiation beam across a scanning direction.

12. A method of calibrating a lithographic apparatus comprising the method of claim 1.

13. A lithography method comprising:
providing a radiation beam using a radiation system;
using a patterning device to impart the radiation beam with a pattern in its cross-section;
projecting the patterned radiation beam onto a target portion of a substrate;
using a scanning mechanism to move the substrate relative to a frame such that the patterned radiation beam moves over a surface of the substrate; and
controlling a power of the radiation beam in dependence on information related to a spatial intensity distribution of the radiation beam in a plane of the substrate determined using the method of claim 1.

14. A lithographic apparatus comprising:
an illumination system configured to condition a pulsed radiation beam;
a reference frame;
a substrate table moveably mounted to the reference frame, the substrate table configured to hold a substrate such that a target portion of the substrate is arranged to receive the radiation beam;
a projection system configured to project the radiation beam onto the substrate;
a calibration sensor that can be positioned on the substrate table during a calibration method;
a scanning mechanism operable, during the calibration method, to move the substrate table relative to the reference frame such that the calibration sensor moves through the beam of radiation in the plane along a scan trajectory; and
a controller configured to determine information related to a spatial intensity distribution of the radiation beam in the plane in dependence on: (a) an output of the calibration sensor; (b) the scan trajectory of the calibration sensor; and (c) a quantity indicative of a velocity of the illumination system relative to the reference frame.

15. The lithographic apparatus of claim 14, further comprising a mechanism operable to determine the quantity indicative of a velocity of the illumination system relative to the reference frame, the mechanism comprising one or more accelerometers mounted on the illumination system.

16. The lithographic apparatus of claim 14, further comprising a mechanism operable to determine the quantity indicative of a velocity of the illumination system relative to the reference frame, the mechanism comprising a camera mounted on the reference frame which is are operable to measure movement of a band of radiation exiting the illumination system.

17. The lithographic apparatus of claim 14, wherein the calibration sensor comprises a sensing element.

18. The lithographic apparatus of claim 17, wherein the calibration sensor comprises an opaque substrate and the sensing element comprises an aperture in the opaque substrate.

19. The lithographic apparatus of claim 18, wherein the sensing element further comprises a radiation sensor disposed behind the aperture.

20. A non-transitory computer product comprising instructions configured to cause a computer system to at least:
determine a quantity indicative of a velocity of an illumination system relative to a reference frame, the illumination system configured to provide a pulsed radiation beam that is projected onto a region of a plane in the reference frame; and
determine information related to a spatial intensity distribution of the radiation beam in the plane in dependence on: (a) an output of a calibration sensor moved relative to the reference frame such that the calibration sensor moves through the radiation beam in the plane along a scan trajectory; (b) the scan trajectory of the calibration sensor; and (c) the quantity indicative of a velocity of the illumination system relative to the reference frame.

* * * * *